(12) United States Patent
Fukada (10) Patent No.: US 7,187,429 B2
(45) Date of Patent: Mar. 6, 2007

(54) ALIGNMENT METHOD, EXPOSURE APPARATUS AND DEVICE FABRICATION METHOD

(75) Inventor: Tsuneari Fukada, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/133,257

(22) Filed: May 20, 2005

(65) Prior Publication Data

US 2005/0219492 A1 Oct. 6, 2005

Related U.S. Application Data

(62) Division of application No. 10/175,834, filed on Jun. 21, 2002, now Pat. No. 6,963,389.

(30) Foreign Application Priority Data

Jun. 27, 2001 (JP) .............................. 2001-194745

(51) Int. Cl.
*G03B 27/42* (2006.01)
*G01B 11/00* (2006.01)

(52) U.S. Cl. ........................................ 355/53; 356/401
(58) Field of Classification Search ................. 355/53, 355/55, 72; 356/399, 400, 401
See application file for complete search history.

(56) References Cited

U.S. PATENT DOCUMENTS

| 4,918,320 | A | 4/1990 | Hamasaki et al. | .......... 250/548 |
|---|---|---|---|---|
| 6,238,851 | B1 | 5/2001 | Nishi | ......................... 430/394 |
| 6,281,965 | B1 | 8/2001 | Nakashima | .................. 355/53 |
| 2001/0049589 | A1 | 12/2001 | Yasuda et al. | .............. 702/150 |
| 2002/0042664 | A1 | 4/2002 | Kikuchi | ..................... 700/114 |
| 2003/0058423 | A1 | 3/2003 | Wakamoto | ................... 355/53 |

*Primary Examiner*—Peter B. Kim
(74) *Attorney, Agent, or Firm*—Fitzpatrick, Cella, Harper & Scinto (57) ABSTRACT

An alignment mark selection method includes steps of determining whether an alignment mark provided in a shot area on a substrate is selectable with respect to each alignment mark, and selecting alignment marks from alignment marks determined to be selectable in the determining step.

5 Claims, 13 Drawing Sheets

SEMICONDUCTOR DEVICE FABRICATION FLOW

ALIGNMENT METHOD, EXPOSURE APPARATUS AND DEVICE FABRICATION METHOD

This application is a divisional application of U.S. patent application Ser. No. 10/175,834, filed Jun. 21, 2002 now U.S. Pat. No. 6,963,389.

FIELD OF THE INVENTION

The present invention relates to an alignment method, an exposure apparatus, and a device fabrication method, used in device fabrication accompanying various micromachining fabrication processes for manufacturing semiconductor devices such as ICs and LSIs, display devices, such as liquid crystal display panels, detection devices, such as magnetic heads, and image sensing devices such as CCDs.

BACKGROUND OF THE INVENTION

Generally, a photolithography process for manufacturing semiconductor devices, and the like, employs an exposure apparatus which transfers a pattern of an original plate (e.g., a mask or a reticle) onto a photoresist-coated substrate. Recently, a projection reduction exposure apparatus advantageous for its high resolution and alignment accuracy is used as the exposure apparatus. Generally, a semiconductor device is fabricated by forming multiple layers of circuit patterns by using different original plates, on plural shot areas arrayed on the substrate.

The shot array of plural shot areas on the substrate is called a shot layout. The shot layout is made in consideration of the size of the substrate, the size of the shot area, the size of the chip area, and the like. Further, a necessary member of shots, selected based on the shot layout, for overlaying circuits for formation of the multilayer circuit, are called sample shots.

Upon selection of sample shots, an arbitrary number of shots is designated, then a determination of selectability of shots as sample shots is performed on all the shots of the shot layout, in accordance with a predetermined selectability determination condition, and a candidate shot group is determined. The selectability determination is made in consideration of the position of an alignment mark within a shot, a distance from a substrate edge of an alignment mark in each shot, a limitation due to a relative positional relation with respect to hardware mechanisms, such as an alignment mark monitoring optical system and a focus measuring system.

Next, the shots of the candidate shot group are ranked in priority order by a priority determination algorithm. In the ranking, shots in the outermost peripheral positions are often ranked to lower ordinal levels. The outermost peripheral shots are positioned on the border between an exposure area and a non-exposure area, and in comparison with inner shots, there is apprehension that the condition of an alignment mark shape, or the like, becomes unstable due to the influence of a fabrication process. When the ranking has been completed, a selection is made from high priority shots, thereby, final sample shots are selected.

Conventionally, as the shot size is smaller in comparison with the substrate size, the number of shots within the substrate is large, and the number of selectable high-priority shots as the sample shots is large. However, with a recent increase in the semiconductor device size or an increase in a one shot exposure area (angle of view), the number of shots within the substrate tends to decrease. The reduction of shots causes a reduction of shots as selection candidates upon a sample shot selection, and by extension, disturbs improvement of alignment accuracy.

The substrate size is also increased, and in such a case, the fabrication device in a fabrication plant must be changed. To enlarge a device or the angle of view of the exposure apparatus while utilizing the conventional facilities, the reduction of alignment selection candidate shots accompanying the reduction of shots within the substrate is unavoidable.

Further, regarding the alignment mark arrangement in the shot, conventionally, measurement marks are arranged in X and Y measurement directions, i.e., an X directional mark is arranged in a horizontal scribe line, and a Y directional mark is arranged in a vertical scribe line, thereby, a measurement error is suppressed to a minimum value. However, in recent years, to improve productivity, various mark arrangements are introduced. For example, a measurement mark capable of simultaneous XY directional measurement, which reduces measurement time, and an in-shot multiple point measurement mark for the purpose of correction of a shot shape are employed.

However, a necessary number of samples cannot be obtained by the conventional sample shot selection, since the number of shots is reduced, although various alignment mark arrangements have been studied. Even if the necessary number of samples can be obtained, the arrangement of shots on the substrate is not desirable.

SUMMARY OF THE INVENTION

The present invention has been made in consideration of the above situation, and has as its object to provide an alignment method, an exposure apparatus, and a device fabrication method, which perform alignment mark selection for alignment measurement in correspondence with a reduction in the number of shots due to an increase in angle of view, an increase in variety of alignment correction methods, and the like, and thereby, to improve alignment accuracy.

According to the present invention, the foregoing object is attained by providing an alignment method comprising a selection step of performing alignment mark selection, in alignment mark units, based on a shot layout and a predetermined logic, from alignment marks accompanying respective shots, a measurement step of measuring positions of alignment marks selected in said selection step among the alignment marks of the respective shots formed on a substrate based on the shot layout, and an alignment step of performing alignment for overlay exposure for the respective shots formed on the substrate, based on the result of the measurement in said measurement step.

According to another aspect of the present invention, the foregoing object is attained by providing an exposure control data generation method comprising a setting step of setting a selectable area for alignment mark selection based on an outer shape of a substrate and a shot layout, a selection step of selecting alignment marks appropriate to alignment from the selectable area, and a generation step of generating exposure control data for a necessary alignment operation by using the alignment mark selected in said selection step.

In still another aspect of the present invention, the foregoing object is attained by providing an exposure control data generation apparatus, comprising setting means for setting a selectable area for alignment mark selection based on an outer shape of a substrate and a shot layout, selection means for selecting alignment marks appropriate to alignment from said selectable area and generation means for generating exposure control data for a necessary alignment operation by using the alignment mark selected by said selection means.

According to one aspect of the present invention, upon selection of an alignment mark for an alignment measurement based on a shot layout, different from the conventional alignment mark selection sample shots in shot units, selection is made by determining applicability of each alignment mark. Accordingly, different from the conventional selection that all the outermost peripheral alignment marks are eliminated, even an alignment mark of an outermost peripheral shot, if it satisfied a predetermined logic, it can be selected as an alignment mark for alignment measurement. Further, in a case wherein plural types of alignment marks are provided for one shot, different from the conventional determination in shot units, different selection logics can be applied to the respective types. Accordingly, the selection can be easily made in correspondence with the increase in the variety of alignment correction methods.

That is, according to the present invention, upon a selectability determination, a selection condition is applied to each alignment mark on the substrate, in consideration of the type, the purpose, and the like, of each alignment, from position information of each alignment mark on the substrate. Thereafter, a necessary number of alignment marks for alignment measurement can be selected, based on a selection algorithm, from selectable alignment marks. At this time, the selection is performed on each alignment mark, which reduces the ill effect on alignment measurement and the result of measurement due to an increase in the number of unselectable marks, which is caused by a reduction of outermost peripheral shots accompanying an increase in the shot angle of view. Further, upon selection of a necessary number of alignment marks, the freedom can be increased.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will now be described in detail in accordance with the accompanying drawings.

Figure 1:
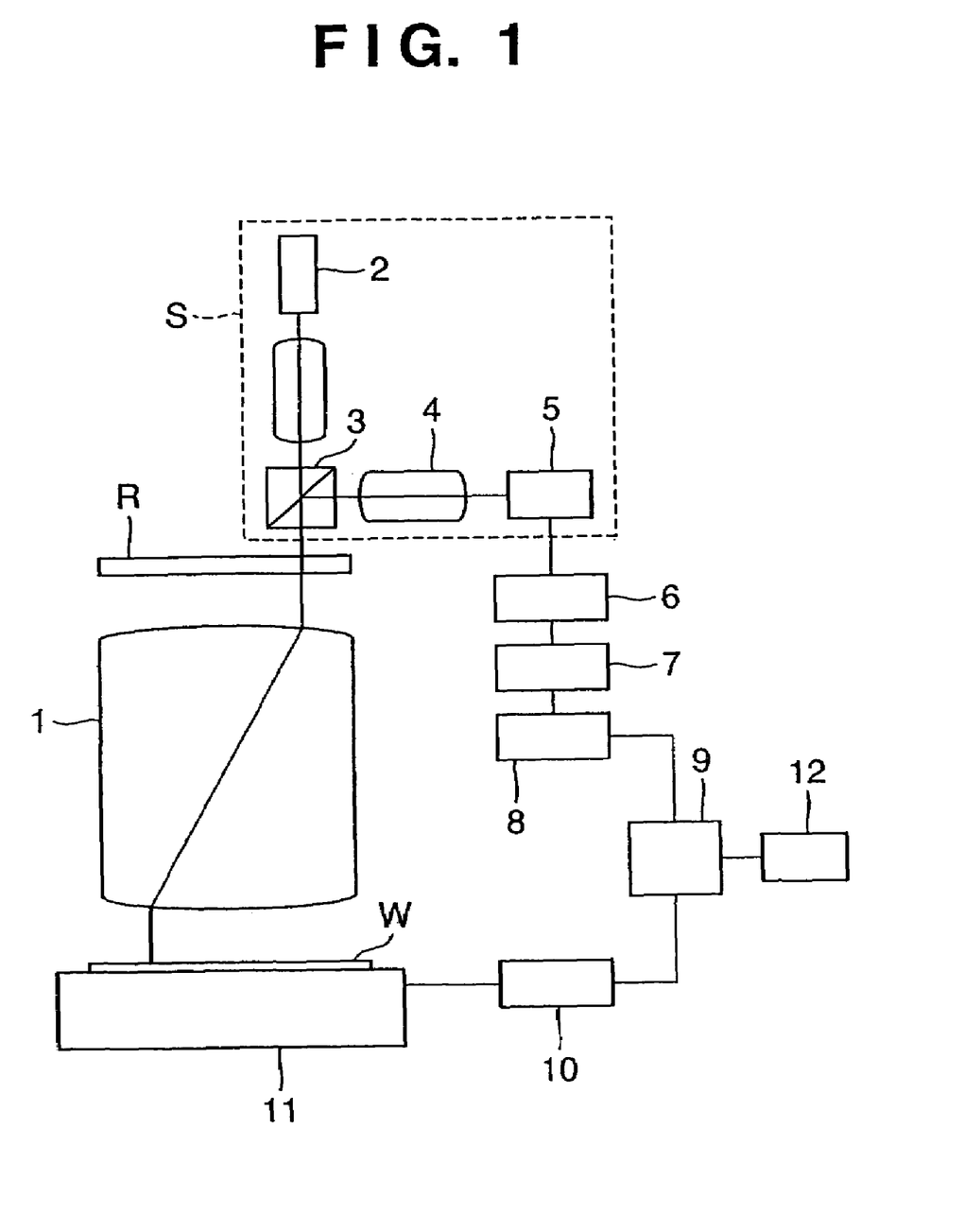
FIG. 1 is a schematic diagram of an exposure apparatus having an alignment apparatus according to an embodiment of the present invention.

FIG. 1 shows an exposure apparatus having an alignment apparatus according to an embodiment of the present invention. In the figure, reference character R denotes a reticle; W, a wafer; reference numeral 1, a projection lens, which projects a pattern of the reticle R onto the wafer W; and S, an alignment optical system for the wafer W. The alignment optical system S has an alignment illumination device 2, a beam splitter 3 provided on an optical path of the illumination device 2, an alignment scope 4 provided on an optical path reflected by the beam splitter 3, and an image sensing device 5, which image-senses a mark on the wafer W via the alignment scope 4. Numeral 6 denotes an A/D converter, which converts an image sensing signal from the image sensing device 5 into a digital signal; 7, an integrating device, which integrates the digital signal from the A/D converter 6; 8, a position detection device, which detects the position of the alignment mark on the wafer W based on the integrated digital signal; 8, a control device, which converts position measurement information of each alignment mark from the position detection device 8 into wafer W grid information; 10, a stage drive device, which drives an XY stage 11 in accordance with the grid information from the control device 9; and 12, a storage device for storing information necessary for processing at the control device 9.

In this construction, illumination light from the alignment illumination device 2 is emitted on the alignment mark on the wafer W via the beam splitter 3 and the projection lens 1. An image of the illuminated alignment mark is formed in the image sensing device 5 via the projection lens 1, the beam splitter 3 and the alignment scope 4. An image sensing signal from the image sensing device 5 is converted by the A/D converter 6 into a digital signal, and further, integrated by the integrating device 7, and outputted for position detection by the position detection device 8. Position information of each alignment mark from the position detection device 8 is statistically processed by the control device 9, and converted to the grid information indicating the position, a scaling and rotation of the entire wafer W. The stage drive device 10 moves the wafer W on the XY stage 11 in accordance with the grid information.

Figure 2:
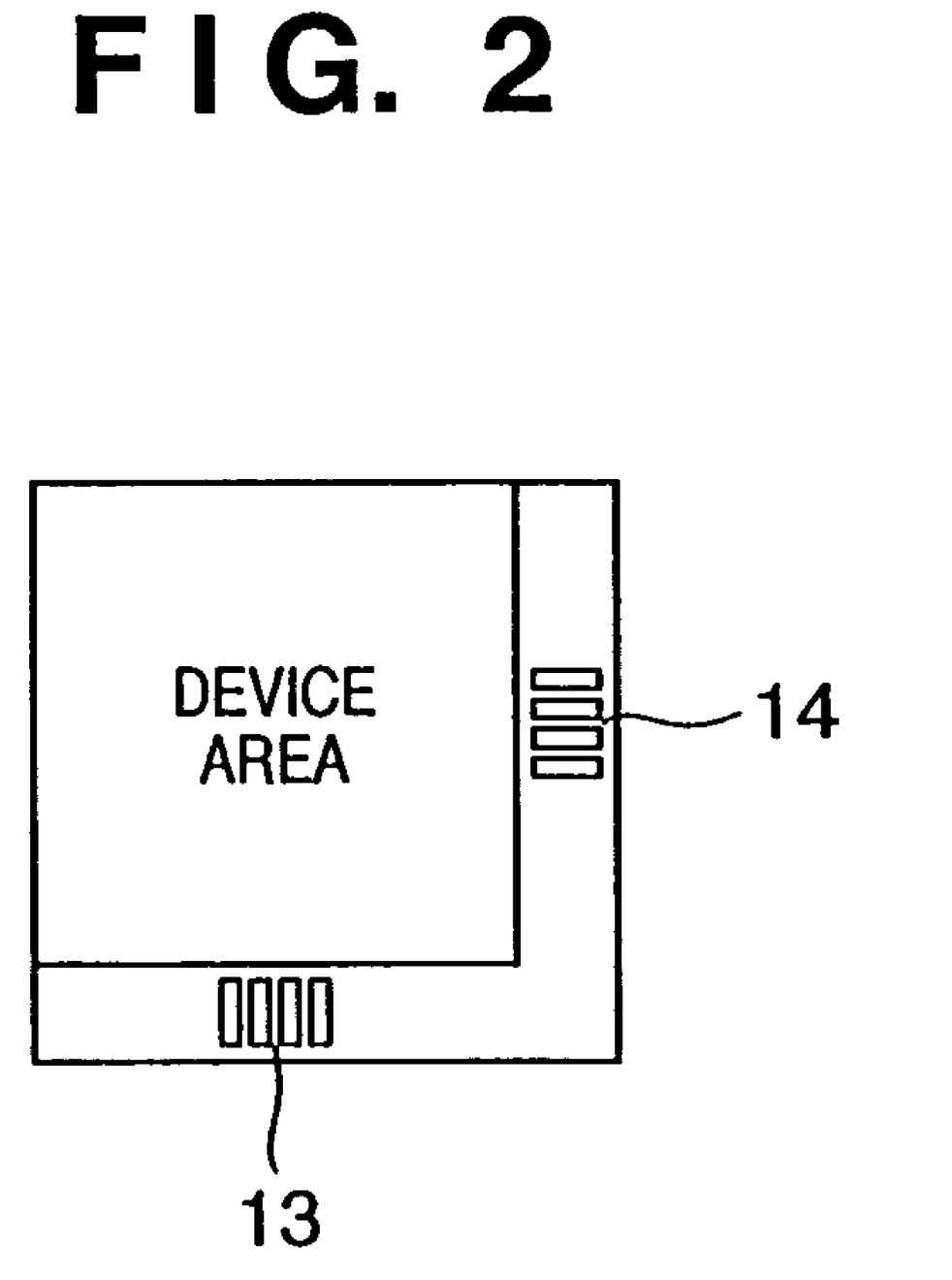
FIG. 2 is an arrangement example of in-shot measurement marks (XY directional independent measurement marks)
Figure 3:
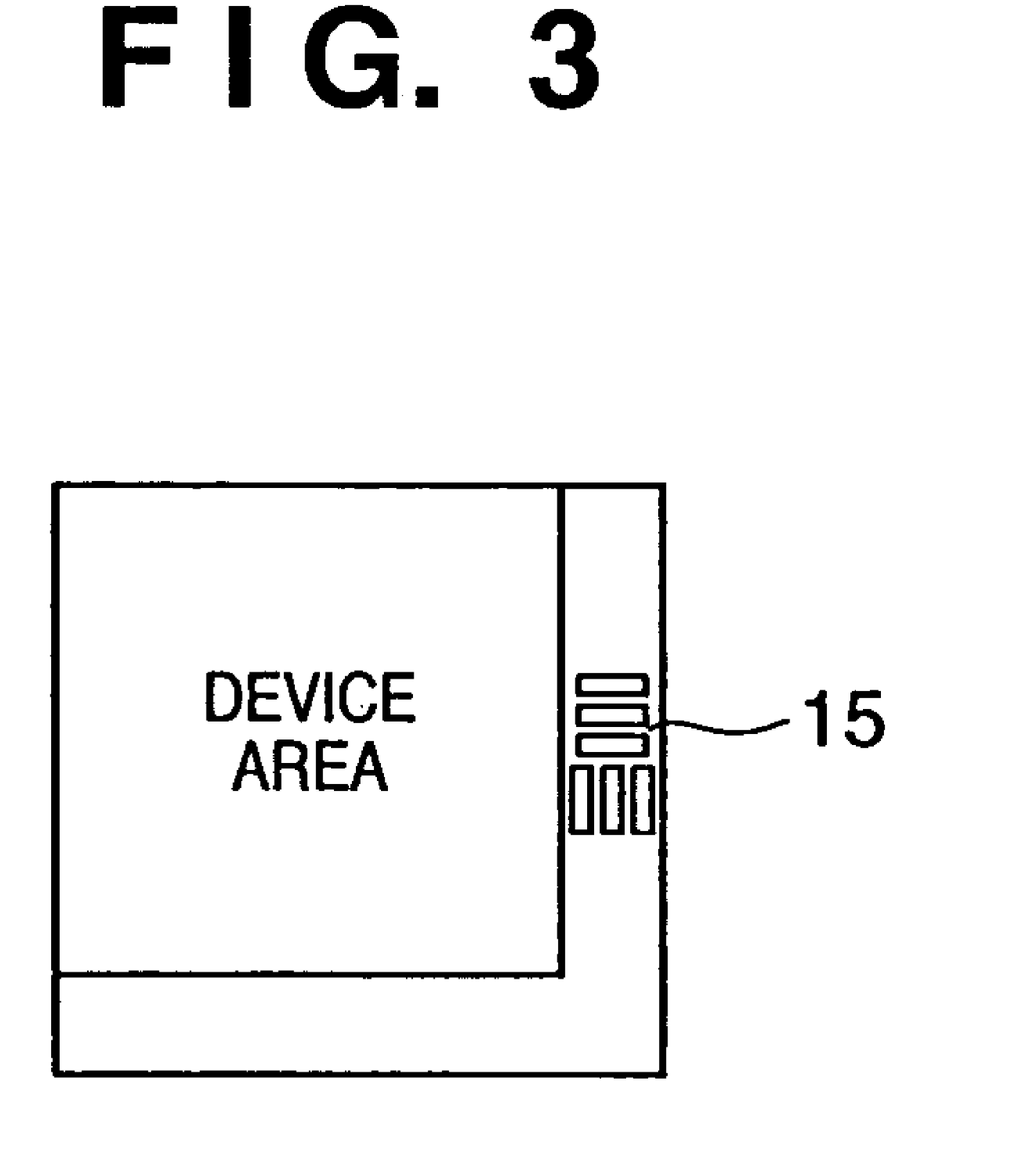
FIG. 3 is an arrangement example of other in-shot measurement marks (XY directional simultaneous measurement marks)
Figure 4:
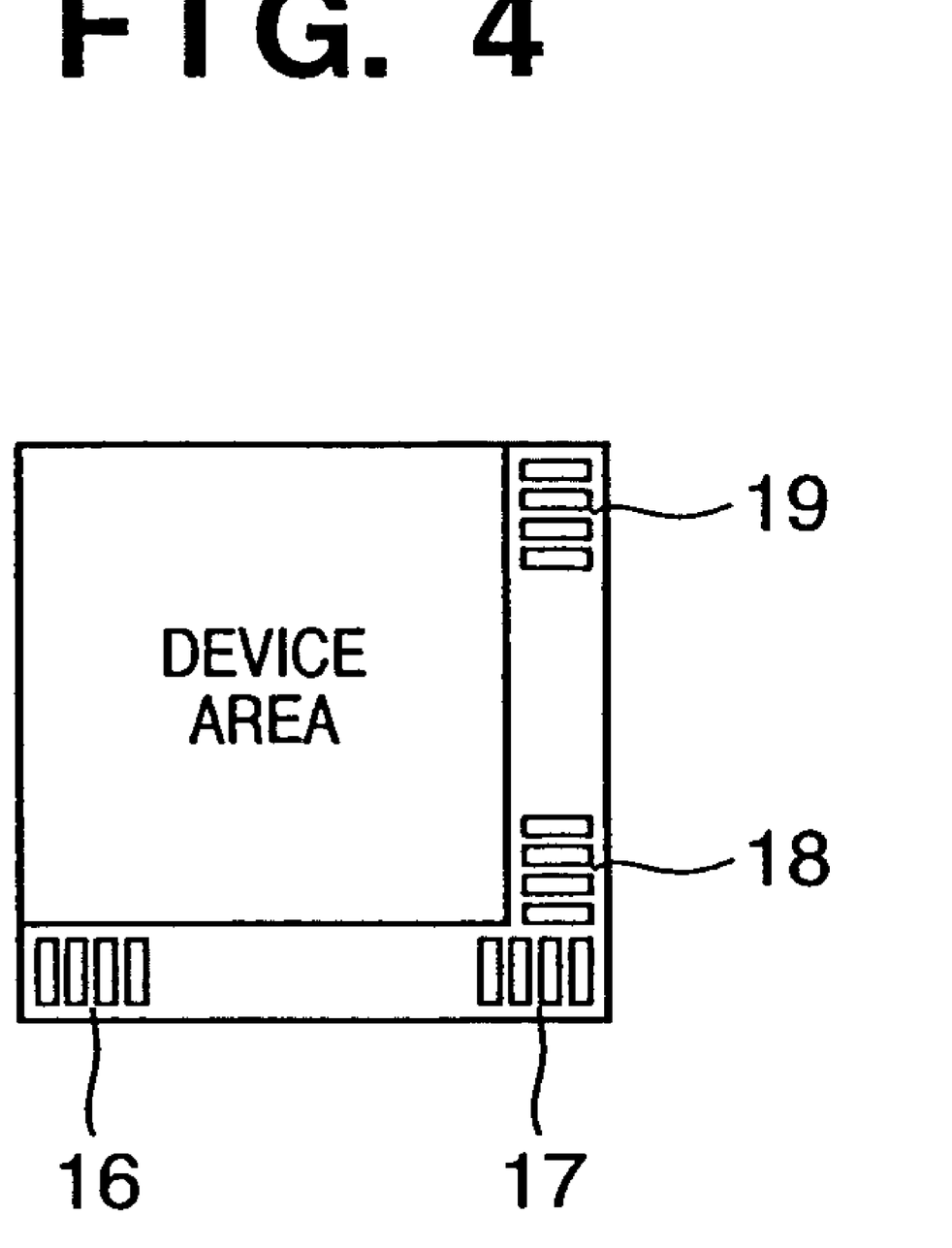
FIG. 4 is an arrangement example of other in-shot measurement marks (plural purpose-based measurement marks)

As examples of arrangements of alignment marks within a shot, FIG. 2 shows an arrangement of XY directional dependent measurement marks within a shot, FIG. 3, an arrangement of XY directional simultaneous measurement marks within a shot, and FIG. 4, an arrangement of plural purpose-based marks within a shot. Numeral 13 in FIG. 2 denotes an X direction measurement mark; 14, a Y direction measurement mark; 15, in FIG. 3, an XY directional simultaneous measurement mark; and 16 to 19, in FIG. 4, marks provided for plural alignment corrections.

Figure 5:
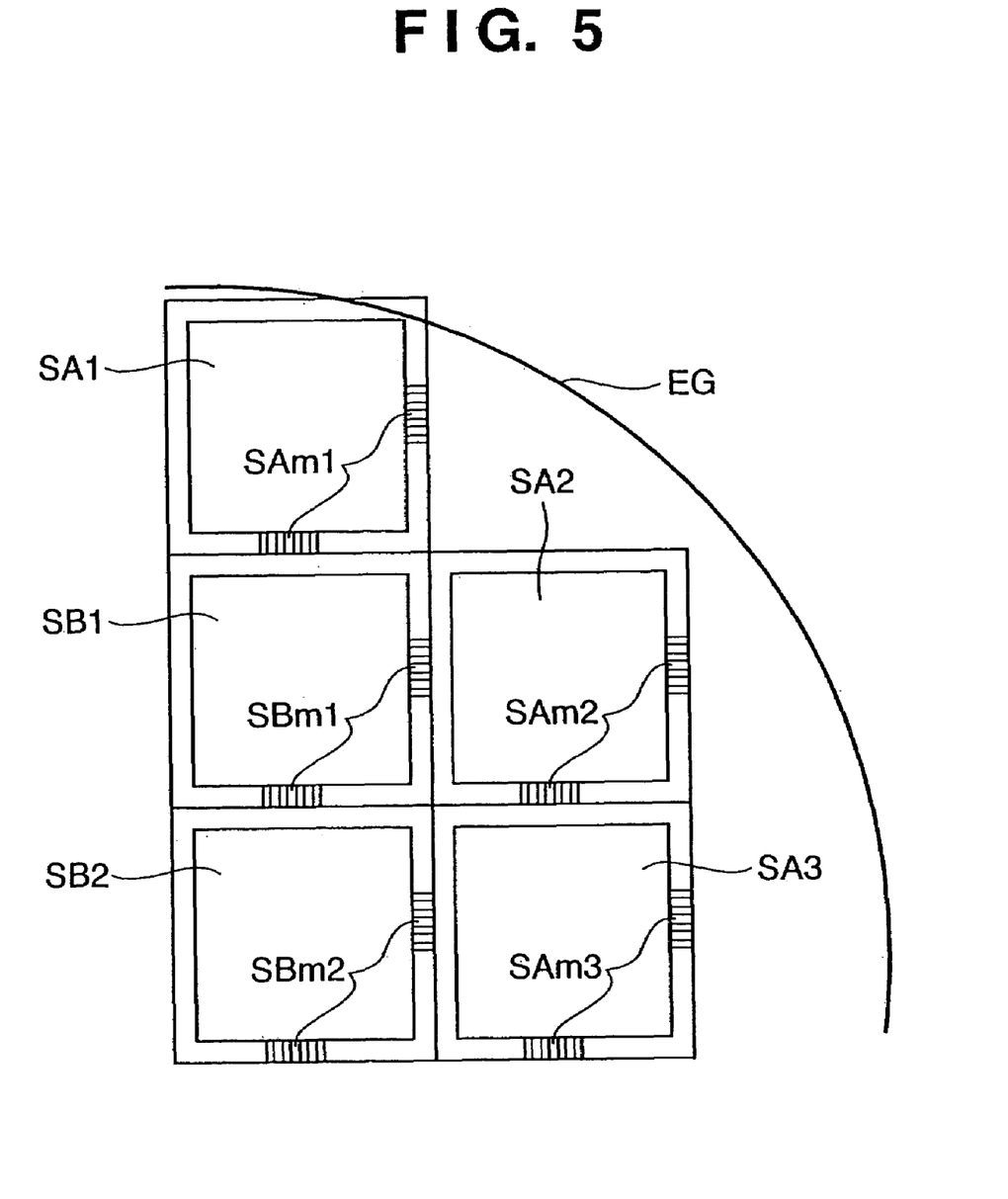
FIG. 5 is a schematic diagram showing an example of the result of an alignment mark selectability determination by the conventional art.

FIG. 5 shows an example of a selection of alignment marks from the XY directional independent measurement marks by the conventional technique. In FIG. 5, symbol EG denotes an edge of a substrate; SA1 to SA3, shots in outermost peripheral positions in a shot layout; SAm1 to SAm3 denote alignment marks belonging to the shots SA1 to SA3, which are not selected by the conventional technique; SB1 and SB2, shots in one-shot inner positions from the outermost peripheral positions; SBm1 and SBm2, alignment marks belonging to the shot SB1 and SB2, which are selected as marks used in measurement by the conventional technique.

Figure 6:
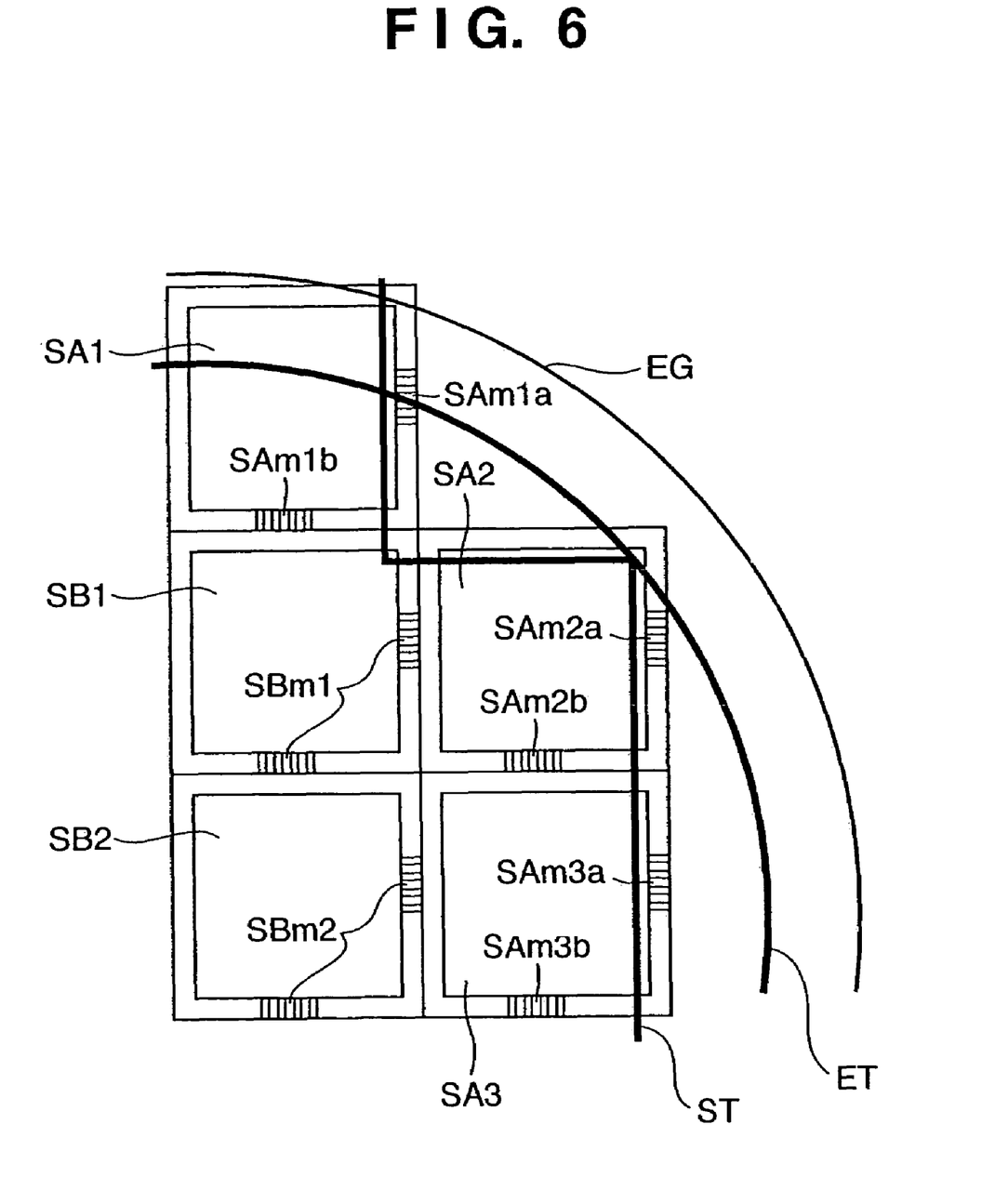
FIG. 6 is a schematic diagram showing an example of the result of an alignment mark selectability determination according to the present invention.

FIG. 6 shows an example of the selection of alignment marks from the XY directional independent measurement marks according to the present embodiment. In the figure, symbol ET denotes a latitude in an alignment mark selectability determination based on a previously-designated distance (hereinafter, ET value) from the substrate edge EG; ST, a latitude in an alignment mark selectability determination based on a previously-designated distance (hereinafter, ST value) from a border between an exposure area and a non-exposure area. Alignment marks within an area determined by the latitudes ET and ST are selectable. Accordingly, alignment marks SAm1b to SAm3b are selectable alignment marks.

Generally, in an area, which is a predetermined-distance away from the substrate edge EG, a device pattern and a non-device pattern, such as an alignment mark, are not formed in an excellent state due to deformation of the substrate itself and influence of the fabrication process. Further, in some cases, pattern formation is not performed for convenience of other process apparatuses than the exposure apparatus and substrate transfer. Accordingly, a latitude value (ET value) determining the latitude ET is determined at the fabrication process and it is often unchangeable.

Figure 7:
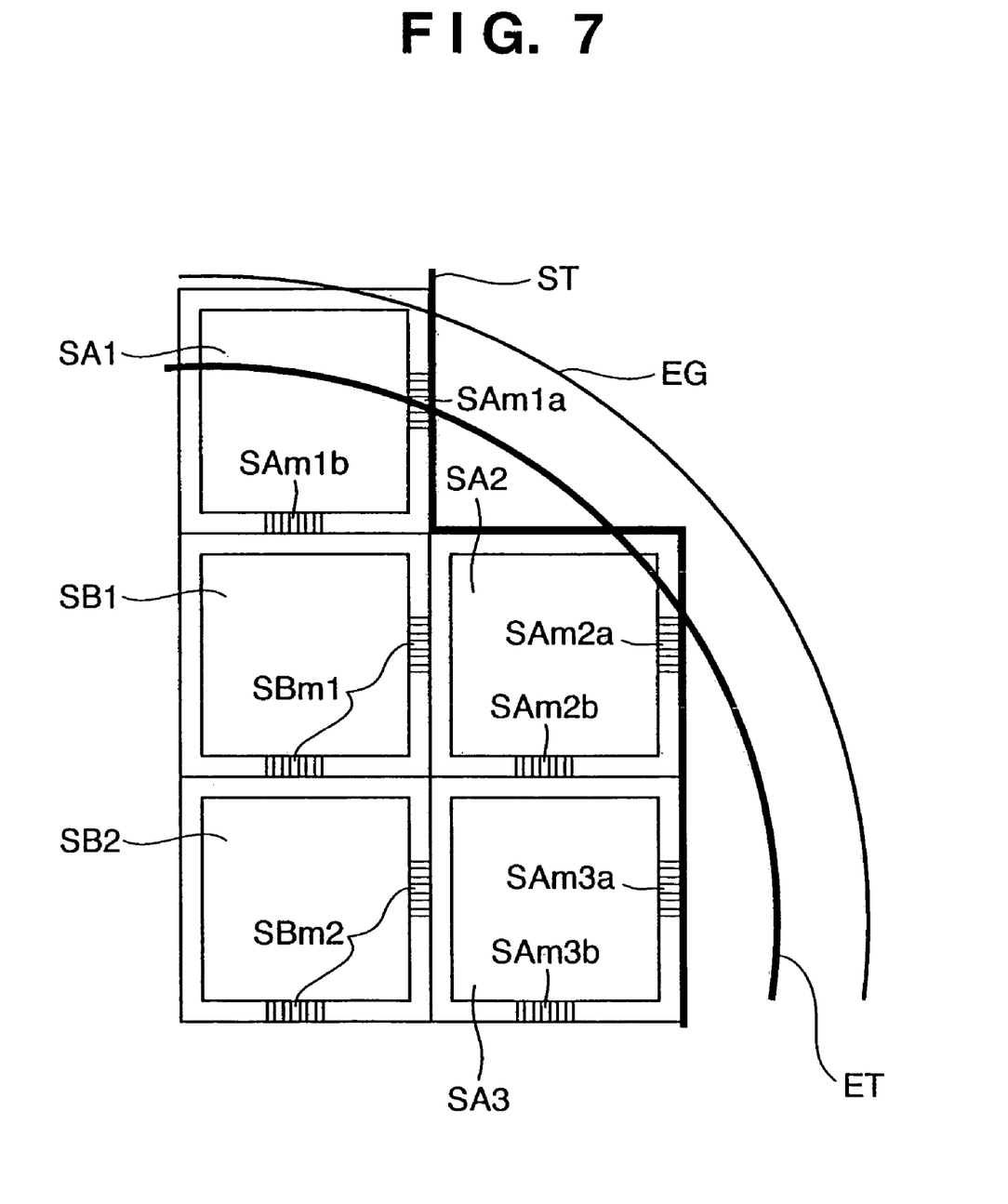
FIG. 7 is a schematic diagram showing another example of the result of an alignment mark selectability determination according to the present invention.

On the other hand, as the pattern status within the exposure area is excellent in many cases, a value to determine the latitude of distance from the border between the exposure area and non-exposure area (ST value) may be set to a smaller value in comparison with the latitude value from the substrate edge EG, depending on the process condition. FIG. 7 shows the result of an alignment mark selectability determination in the case wherein the latitude value to determine the latitude ST is set to a small value. In this manner, the alignment marks SAm2a and SAm3a may be selectable by reducing the latitude value (reducing the distance from the border). Further, the determination of the ST value may be made in consideration of the position of an alignment mark within a shot.

Figure 8:
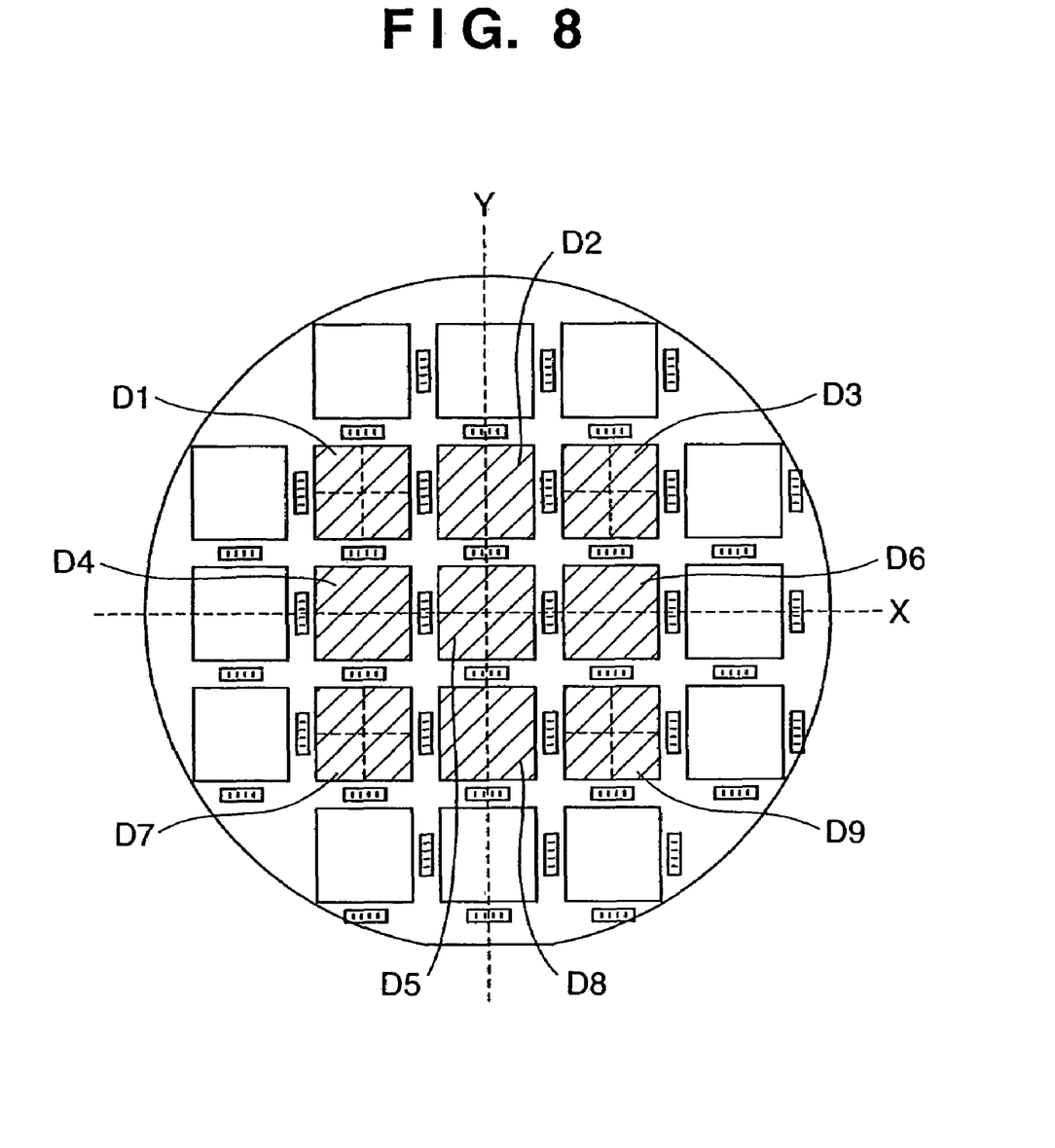
FIG. 8 is a schematic diagram showing an example of the result of an alignment mark selectability determination on the entire substrate by the conventional art.

FIG. 8 shows the result of an alignment mark selectability determination in the use of the XY directional independent measurement marks on the entire substrate by the conventional art. In the figure, alignment marks belonging to shots D1 to D9 are selectable. Since the alignment marks are selected in shot units and alignment marks belonging to outermost peripheral shots are not selected, the number of selectable alignment marks is reduced and the selectable marks are concentrated around the center of the substrate as the shot angle of view increases with respect to the substrate.

Figure 9:
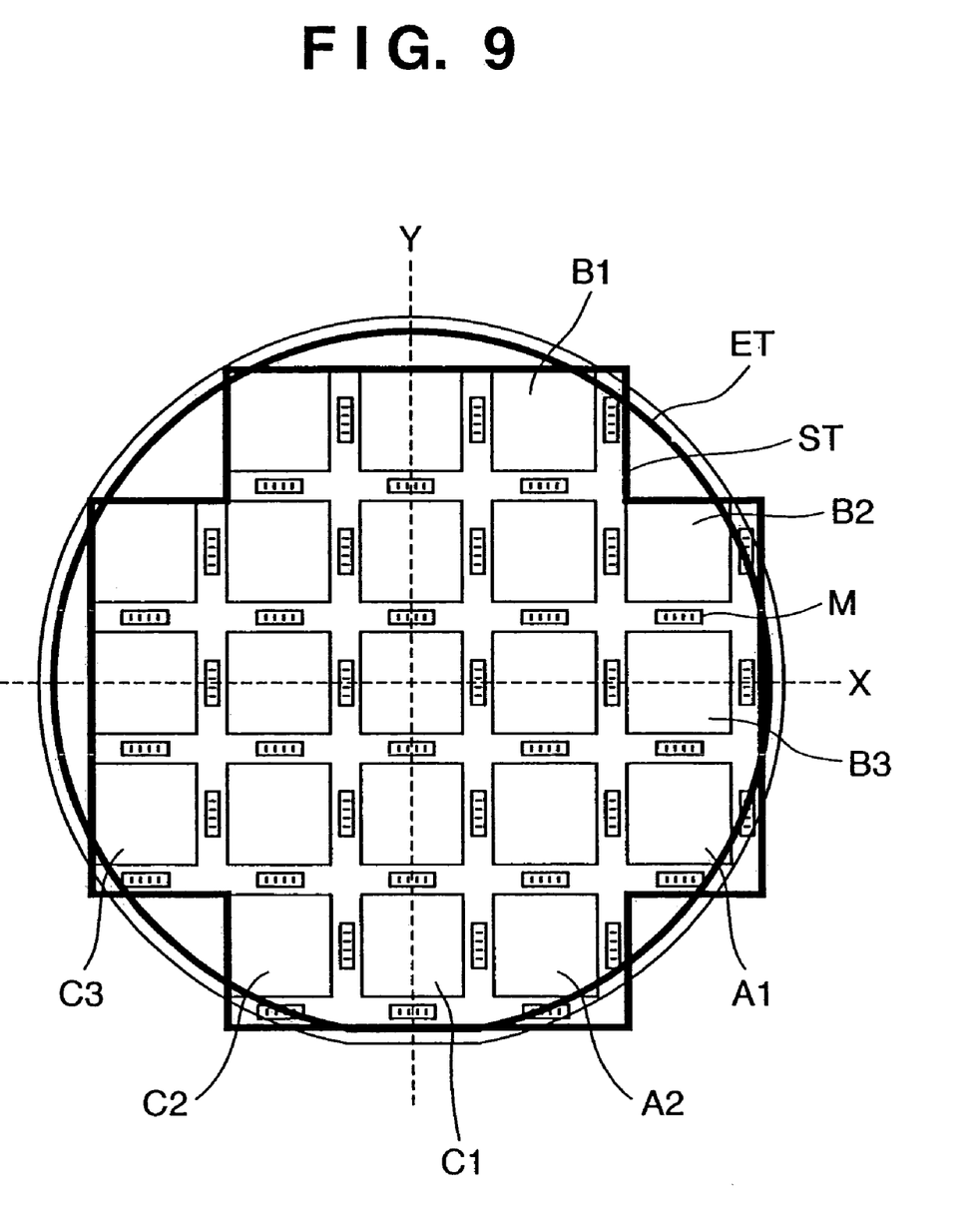
FIG. 9 is a schematic diagram showing an example of the result of an alignment mark selectability determination on the entire substrate according to the present invention.

FIG. 9 shows the result of an alignment mark selectability determination according to the present embodiment, in the use of the XY directional independent measurement marks, on each alignment mark M, based on position information of each alignment mark, the distance from the substrate edge and the latitude value of distance from the substrate edge, and the distance from the border between an exposure area and a non-exposure area, and the latitude value of the distance therefrom. In FIG. 9, an AND area within the latitudes ET and ST is a selectable area, and alignment marks within the selectable area are selected. In FIG. 9, alignment marks selectable in entire X and Y direction areas exist around the X axis and Y axis. Thus, alignment mark selection for various alignment operations can be made, and alignment accuracy can be improved. X and Y directional alignment marks of shots A1 and A2, Y directional measurement alignment marks of shots B1 to B3, and X directional measurement alignment marks of shots C1 to C3 are unselectable.

Note that in the embodiment shown in FIG. 9, the same determination condition is applied to the X directional measurement mark and the X directional measurement mark. However, it may be arranged such that independent latitudes are set for the respective marks in accordance with purpose, process condition, alignment correction method, and the like, of each mark. For example, if X and Y directional measurement marks are independent, as shown in FIG. 2, the condition for specifying a selectable area for the X directional measurement mark may be different from that for the Y directional measurement mark. Further, if three types of measurement marks exist, as shown in FIG. 4, three types of selectable areas may be set.

The alignment mark selection processing as described above is performed by a recipe generation function provided in, e.g., the control device 9 in the exposure apparatus, and alignment marks selected by the processing are applied to actual exposure processing.

Figure 12:
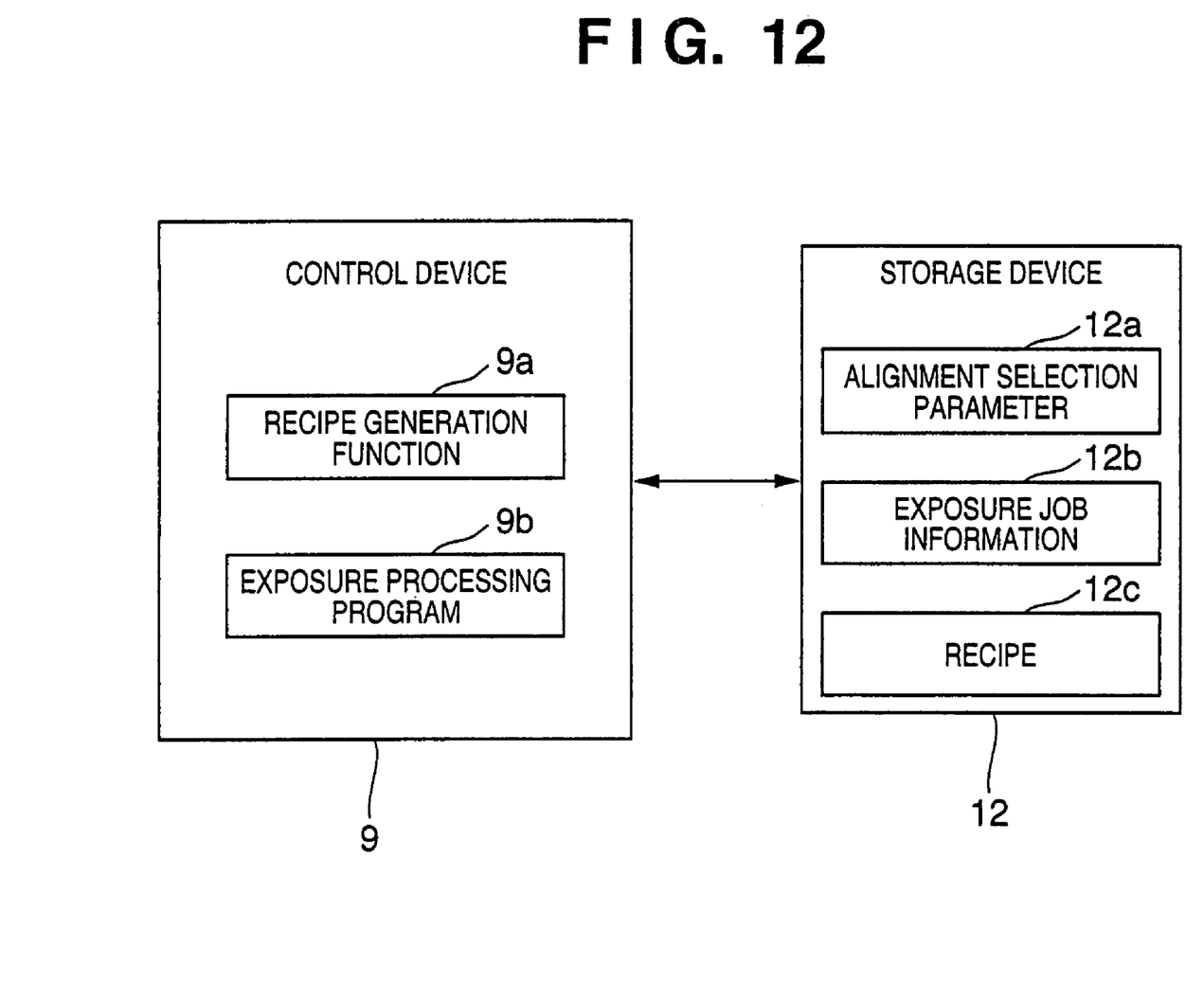
FIG. 12 is a block diagram showing a construction of a recipe generation function of a control device of the exposure apparatus.

FIG. 12 shows a construction of the recipe generation function for the control device 9 of the exposure apparatus according to the embodiment. The recipe generation function 9a performs the alignment mark selection as described with reference to FIGS. 6, 7 and 9, and generates a recipe 12c (a data set indicating the way to process a wafer). An exposure processing program refers to the recipe 12c, performs wafer alignment by alignment processing, and then performs the well-known exposure processing to print a reticle pattern on the wafer.

Further, an alignment selection parameter 12a and exposure job information 12b are stored in the storage device 12. In the alignment selection parameter 12a, the above-described ST value and ET value are registered for each exposure job type. The exposure job information 12b is one or plural types of exposure jobs including information on wafer type, shot area, exposure condition, and the like.

Figure 13:
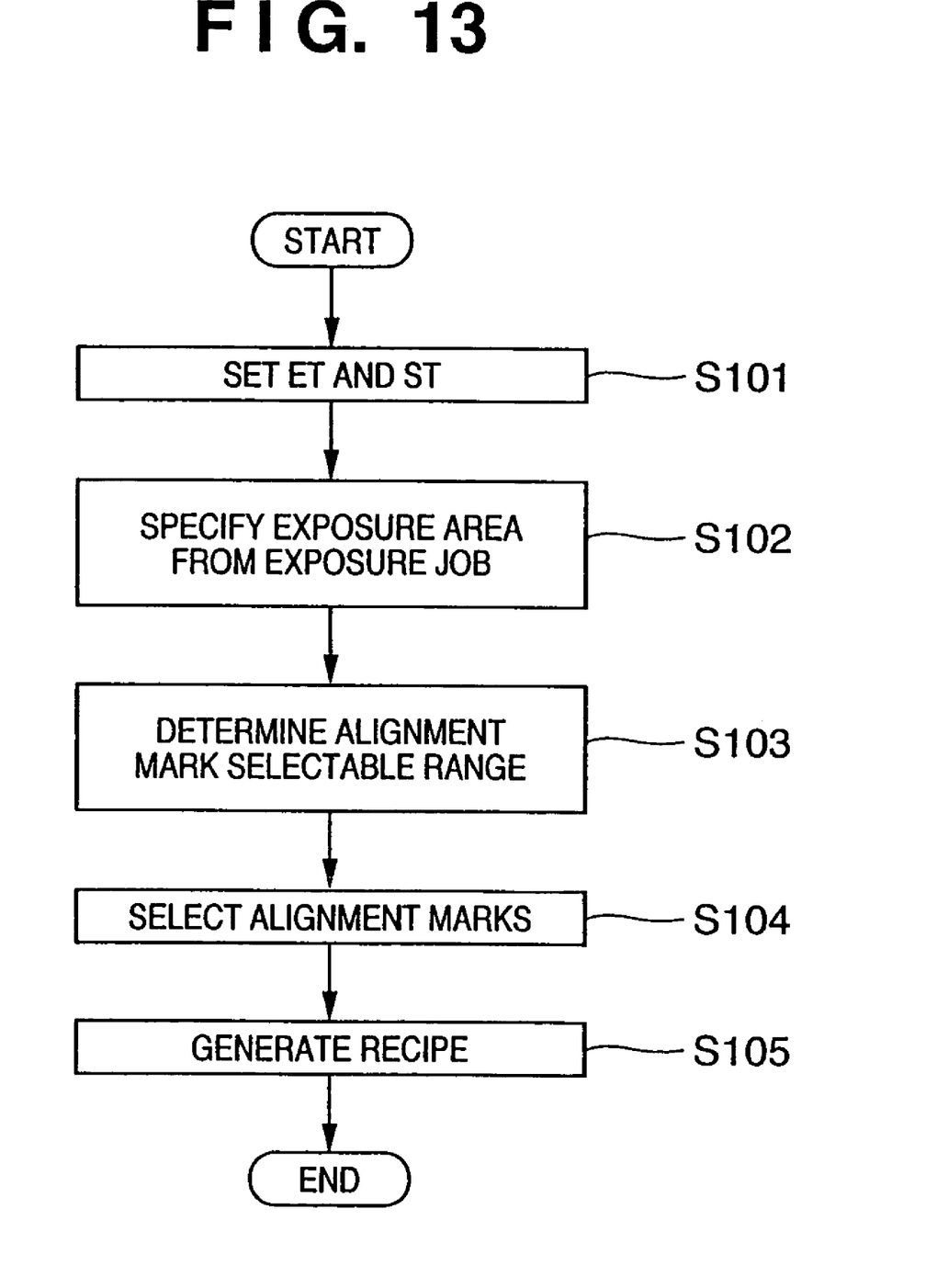
FIG. 13 is a flowchart showing processing by the recipe generation function.

FIG. 13 is a flowchart showing processing by the recipe generation function 9a. First, at step S101, the ST value and the ET value corresponding to an exposure job to be performed are obtained from the alignment selection parameter 12a. Note that, in the embodiment, the ST value and ET value are selected based on the exposure job. However, the invention is not limited to this arrangement. For example, the ST value may be selected in correspondence with the type of an alignment mark, the position of an alignment mark within a shot, or the like. Further, the ET value may be selected based on a wafer to be used. At step S102, an exposure area (shot layout) is obtained from the exposure information 12b corresponding to the exposure job to be performed, and the border between an exposure area and a non-exposure area is specified.

At step S103, the latitude ST and the latitude ET as described in FIGS. 6, 7 and 9 are determined based on the type of wafer to be used in the exposure job (shape and size), the border specified at step S102, and the ET value and the ST value obtained at step S101. Then, an area where the latitudes ST and ET overlap with each other (AND area) is set as an alignment mark selectable range.

At step S104, several alignment marks applicable to alignment processing are selected from the alignment mark selectable range set at step S103. Then, at step S105, a recipe (12c) appropriate to the exposure is generated based on the alignment marks selected at step S104 and the exposure job information, and is stored into the storage device 12.

The exposure processing program 9b performs the exposure processing in accordance with the recipe 12c generated as described above. That is, the program performs wafer alignment by using the alignment marks selected at step S104, and performs the exposure.

Note that, in the present embodiment, the latitude ET is appropriately set to an area about 3 mm away from the wafer outer periphery (ET value=3 mm), and the latitude ST, to an area about 1 to 2 mm away from the exposure area (ST value=1 to 2 mm). Respective optimum values are determined in correspondence with the type of the wafer, the type of the shot, or the characteristic of the exposure apparatus. Further, as an example of the alignment mark selection at step S104, selection is made such that alignment marks are rotationally symmetrical with respect to the wafer center as much as possible. Otherwise, the selection method disclosed in U.S. Pat. No. 4,918,320 may be used. Note that in U.S. Pat. No. 4,918,320, an alignment mark selection reference in shot units is described. Apparently, the reference can be applied to the reference of the selection in alignment mark units.

Further, in the embodiment, the exposure apparatus has the recipe generation function. However, it may be arranged such that the recipe generation function is realized by an external computer, and a generated recipe is downloaded to the exposure apparatus.

[Device Fabrication Method]

Figure 10:
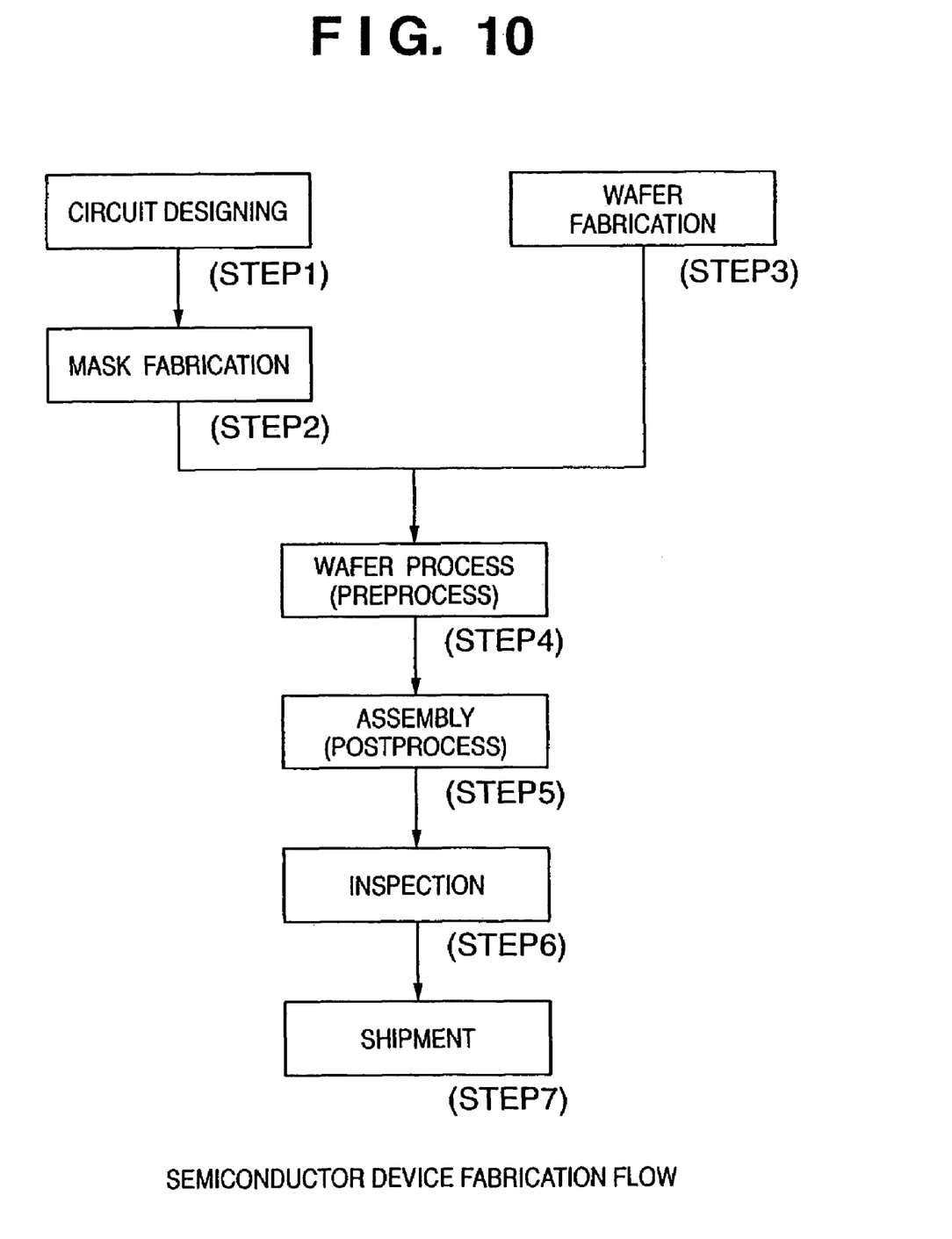
FIG. 10 is a flowchart showing a microdevice fabrication process.

Next, a description will be made about an embodiment of a device fabrication method utilizing the above-described projection exposure apparatus or alignment method. FIG. 10 shows a microdevice (e.g., a semiconductor chip, such as an IC or LSI, a liquid crystal panel, a CCD, a thin-film magnetic head, a micromachine, or the like) fabrication flow. At step 1 (circuit designing), a device pattern is designed. At step 2, a mask where the designed pattern is formed is fabricated. On the other hand, at step 3 (wafer fabrication), a wafer is fabricated by using a material such as silicon or glass. At step 4 (wafer process), called a preprocess, an actual circuit is formed on the wafer by a lithography technique using the above mask and wafer. At the next step, step 5 (assembly), called a postprocess, a semiconductor chip is fabricated by using the wafer carrying the circuit formed at step 4. Step 5 includes an assembly process (dicing and bonding), a packaging process (chip encapsulation), and the like. At step 6 (inspection), inspections such as an operation check, a durability test, and the like, are performed on the semiconductor device formed at step 5. The semiconductor device is completed through these processes, and is shipped (step 7).

Figure 11:
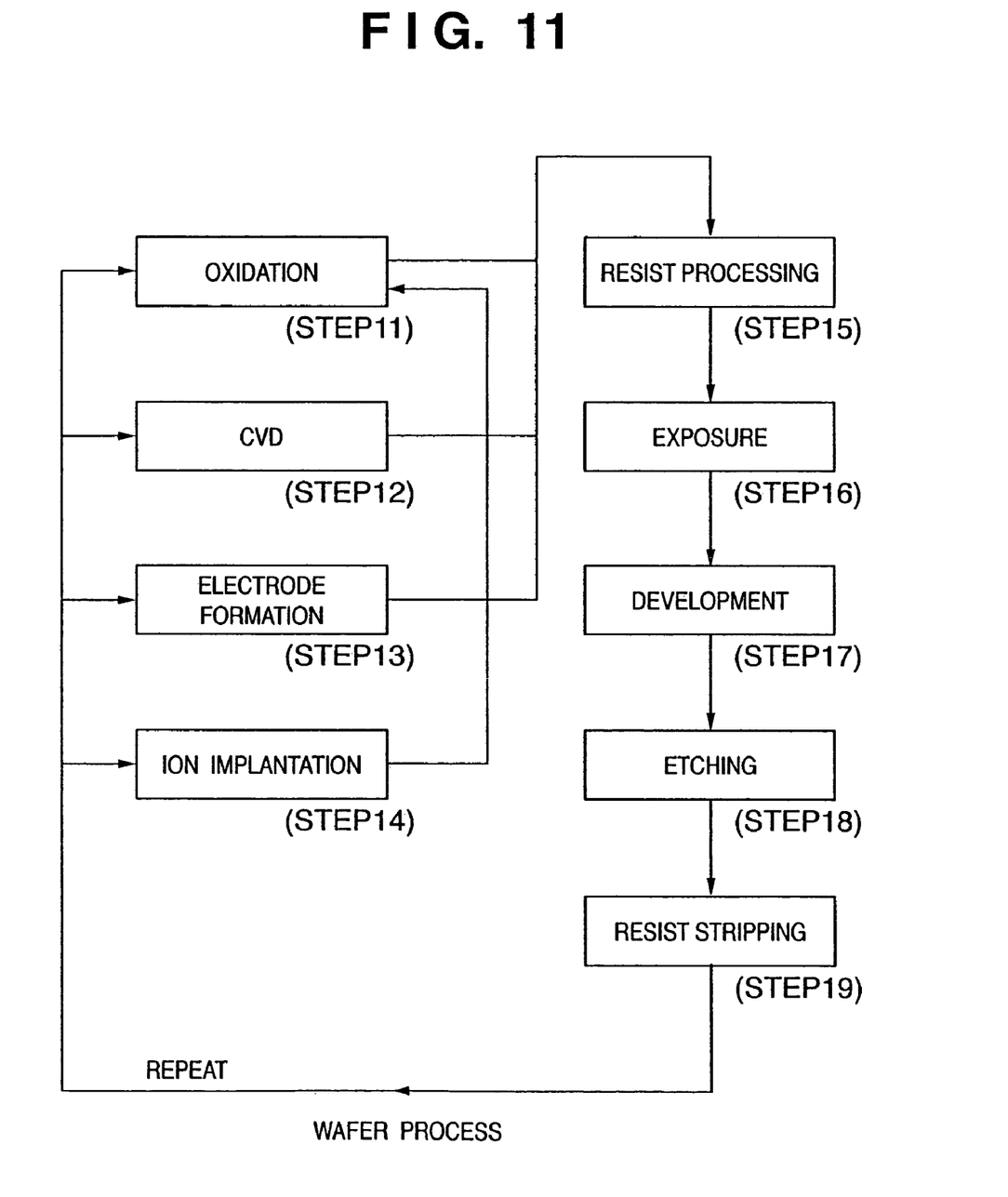
FIG. 11 is a flowchart showing a wafer process in FIG. 10, in detail.

FIG. 11 shows the detailed flow of the wafer process (step 4). At step 11 (oxidation), the surface of the wafer is oxidized. At step 12 (CVD), an insulating film is formed on the surface of the wafer. At step 13 (electrode formation), electrodes are formed by vapor deposition on the wafer. At step 14 (ion implantation), ions are injected in the wafer. At step 15 (resist processing), the wafer is coated with a photoresist. At step 16 (exposure), the mask circuit pattern is exposure-printed on the wafer by the above-described exposure apparatus or method. At step 17 (development), the exposed wafer is developed. At step 18 (etching), portions other than the developed resist are removed. At step 19 (resist stripping), the resist, which is unnecessary after the completion of etching, is removed. These steps are repeated, to form multiple layers of circuit patterns on the wafer.

In the present embodiment, at each process, upon exposure (step 16), high overlay accuracy is obtained, and the efficiency of the semiconductor device fabrication can be improved.

As described above, according to the present invention, as alignment marks for alignment measurement are selected in alignment mark units, selectability is determined by each alignment mark or each type of alignment mark. Further, a necessary number of alignment marks can be selected in correspondence with an enlarged angle of exposure view or various alignment methods. Accordingly, the alignment accuracy can be improved.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for alignment of a substrate and exposure of the aligned substrate to a pattern, said apparatus comprising:

an alignment optical system configured to sense an image of an alignment mark on the substrate;

a position detector configured to detect position of the alignment mark based on the sensed image;

a controller configured to select alignment marks on the substrate to be sensed by said alignment optical system, to control the alignment based on positions of the selected alignment marks detected by said alignment optical system and said position detector, and to control the exposure of the aligned substrate, said controller being configured so that a first alignment mark in an outermost peripheral shot on the substrate is selectable if a first distance of the first alignment mark from an edge of the substrate is greater than a first value and a second distance of the first alignment mark from a border between an exposure area and a non-exposure area is greater than a second value; and a storage configured to store the first value and the second value.

2. An apparatus according to claim 1, wherein the second value is selected in correspondence with a type of the first alignment mark.

3. An apparatus according to claim 2, wherein the type of the first alignment mark corresponds to a direction in which a position of the first alignment mark is detected.

4. An apparatus according to claim 1, wherein the first value is selected based on a substrate to be used.

5. A method of manufacturing a device, said method comprising steps of:

exposing a substrate to a pattern using an exposure apparatus as defined in claim 1;

developing the exposed substrate; and processing the developed substrate to manufacture the device.

* * * * *